United States Patent

Singh et al.

[11] Patent Number: 6,064,245
[45] Date of Patent: May 16, 2000

[54] DYNAMIC CIRCUIT FOR CAPTURING DATA WITH WIDE RESET TOLERANCE

[75] Inventors: Rajinder Paul Singh; Pei-Chun Liu, both of Austin, Tex.; Song Kim, Santa Clara, Calif.

[73] Assignee: International Business Machines Corporation, Armonk, N.Y.

[21] Appl. No.: 09/026,087

[22] Filed: Feb. 19, 1998

[51] Int. Cl.[7] .................................................. H03K 3/027
[52] U.S. Cl. .......................................... 327/200; 365/203
[58] Field of Search ..................................... 327/198, 200, 327/201, 208, 210, 211, 212, 214, 225; 326/31, 93, 95; 365/203

[56] References Cited

U.S. PATENT DOCUMENTS

| 5,291,076 | 3/1994 | Bridges et al. | 326/52 |
| 5,369,315 | 11/1994 | Tran | 326/82 |
| 5,416,744 | 5/1995 | Flannagan et al. | 365/203 |
| 5,640,108 | 6/1997 | Miller | 326/105 |
| 5,825,224 | 10/1998 | Klass et al. | 327/200 |

*Primary Examiner*—My-Trang Nu Ton
*Attorney, Agent, or Firm*—Anthony V. S. England

[57] ABSTRACT

The present invention is directed to an apparatus for precharging complementary data circuits. The apparatus comprises two hold circuits, one for storing the data and the other for storing its complement. A signal for initiates precharging the hold circuits to the same signal level, where the signal for initiating the precharging of the hold circuits is dependent on the hold circuits' outputs.

10 Claims, 2 Drawing Sheets

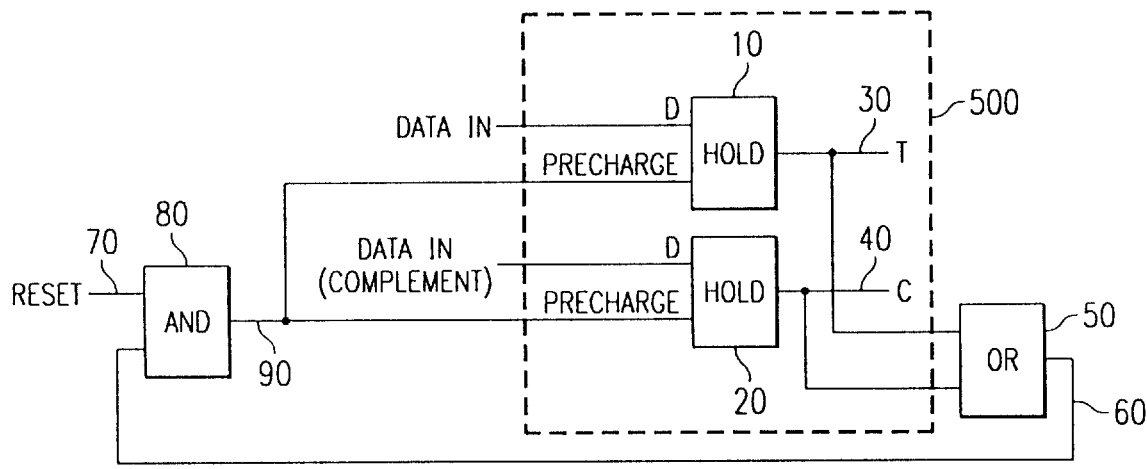
FIG. 1
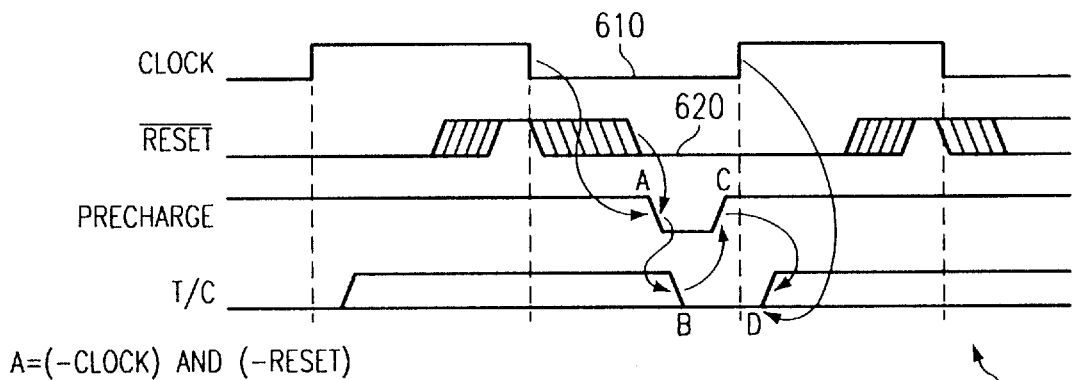
A=(-CLOCK) AND (-RESET)
B=(-PRECHARGE)
C=(-T) AND (-C)
D=(+CLOCK) AND (SELLECTED DATA IN)
FIG. 3
| C | T | OUTPUT 240 |
|---|---|---|
| 0 | 0 | 0 |
| 0 | 1 | 1 |
| 1 | 0 | 1 |
| 1 | 1 | 1 |
FIG. 4
| OUTPUT 240 | $\overline{CLK}$ | OUTPUT 240 AND $\overline{CLK}$ | OUTPUT 280 |
|---|---|---|---|
| 0 | 0 | 0 | 1 |
| 0 | 1 | 0 | 1 |
| 1 | 0 | 0 | 1 |
| 1 | 1 | 1 | 0 |
FIG. 5
| $\overline{RST}$ | OUTPUT 280 | $\overline{RST}$ NOR OUTPUT 280 | PRECHARGE INDICATOR 330 |
|---|---|---|---|
| 0 | 0 | 1 | 0 |
| 0 | 1 | 0 | 1 |
| 1 | 0 | 0 | 1 |
| 1 | 1 | 0 | 1 |
FIG. 6

DYNAMIC CIRCUIT FOR CAPTURING DATA WITH WIDE RESET TOLERANCE

BACKGROUND OF THE INVENTION

The present invention generally relates to control circuits for digital signal storage devices.

FIELD OF THE INVENTION

Traditionally, "static" logic gates have been utilized in computers to perform logic functions, for example, mathematical operations. Static logic gates are those which can continuously perform logic operations so long as electrical power is available. In other words, static logic gates need no electrical precharge, or refresh, in order to properly perform logic operations. Static logic gates can be easily connected together in sequence to collectively perform logic functions in an efficient manner.

However, static logical gates are slow individually. In addition, when static logic gates are pipelined, the resulting logic operation is performed in an even slower manner.

"Dynamic" logic gates are also known in the art. Dynamic logic gates are used in the conventional design of logic circuits which require high performance and modest size. Dynamic logic gates are much faster than static logic gates. However, dynamic logic gates require a periodic electrical precharge, or refresh, such as with a dynamic random access memory (DRAM), in order to maintain and properly perform their intended logic function. Once an electrical precharge supplied to a dynamic logic gate has been discharged by the dynamic logic gate, the dynamic logic gate can no longer perform another logic function until subsequently precharged.

To obtain highest operational speed and shortest cycle time to logic circuits employing currently available MOS technology, it is common practice to employ so-called "dynamic" logic circuits in preference to static logic circuits. Generally, in dynamic circuits the goal of maximizing the speed at which a logical function is performed (e.g. "evaluation") is achieved by minimizing the number of switching devices in the evaluation path, and by employing NMOS, rather than the slower-switching PMOS, for the majority of devices in the evaluation path. This optimization of speed of the evaluation path or "forward path", is achieved at the cost of subsequently having to "reset", or "pre-charge", the dynamic nodes, in preparation for the next logic cycle, to a state from which they may be switched to the other logic state most rapidly, and then only when necessary in accordance with input signals which are evaluated.

The circuits are precharged to a level by a reset pulse. Propagating logic signals will cause the circuit to switch in only one direction, if at all. The relationship between the reset pulse that pre-charges the circuit and the system clock is critical. If the reset pulse lasts too long, it will delay the propagation of data. If it ends too soon, the reset pulse may not pre-charge the circuit properly. What is needed is a way to use an indication of the dynamic logic circuit to set the reset pulse width and to ensure that the circuit has been precharged correctly.

SUMMARY OF THE INVENTION

The current invention provides a method and apparatus to end the pre-charge of dynamic logic circuits when the dynamic logic circuit is fully pre-charged. Thus, the logic circuit is not as reliant on the timing of the reset signal, and can function in a more efficient manner. The output of the dynamic logic circuit combined with a reset pulse fully controls the timing of the resultant pre-charge signal.

The circuit will receive and hold complementary data following a precharge signal. The current data and its complement are ORed together out of dynamic hold data latches to provide an enable signal, and since one of the latch outputs must be logically true, the output of the ORed complementary signals must also be true. This ORed or enable signal is ANDed with the reset signal. Thus, when valid data is present in the dynamic logic circuit, the ORed signal is true. When the reset signal is asserted, the combined ANDed signal is true. This then serves to initiate precharge of the dynamic logic circuit.

When the hold circuits are fully precharged and ready to output any new selected data, the outputs of the hold circuits are driven low in the preferred embodiment. Thus, when the hold circuits both go false, the hold circuits' outputs ORed together also goes false. The ANDed output of the ORed hold circuits and the reset signal goes false also, and the reset signal is degated. Thus, the precharge signal pulse is timed by the precharge characteristics of the data hold circuit and does not impede the loading of any clocked data.

BRIEF DESCRIPTION OF THE DRAWINGS

FIG. 1 is a block diagram of an embodiment of the invention.

FIG. 3 is a timing diagram of an embodiment of the invention.

FIG. 4 is a logic diagram of output 240 of FIG. 2.

FIG. 5 is a logic diagram of output 280 of FIG. 2.

FIG. 6 is a logic diagram of precharge indicator 330 of FIG. 2.

DETAILED EMBODIMENT OF THE INVENTION

Figure 2:
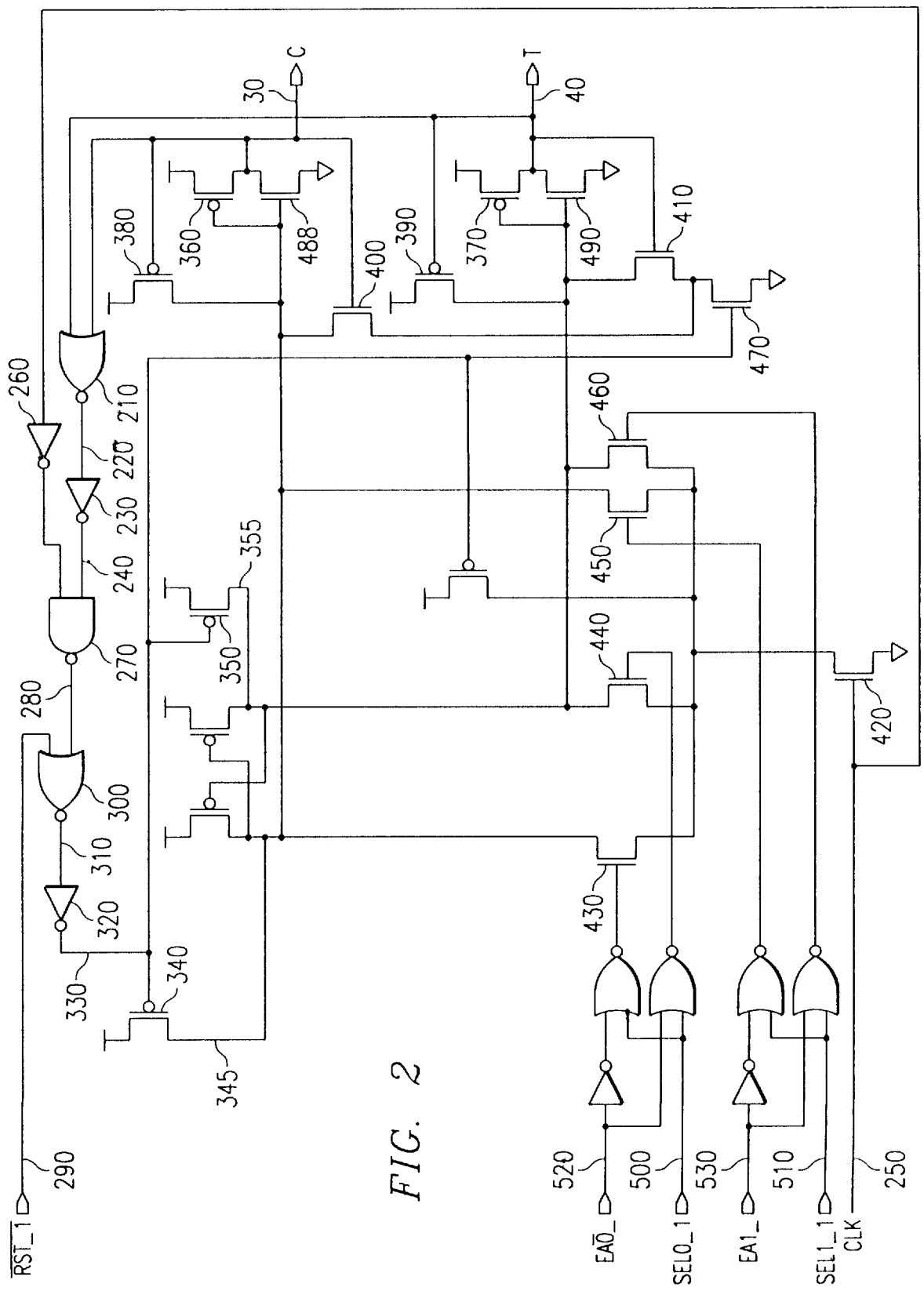
FIG. 2 is a detailed schematic of an embodiment of the invention.

The present invention details an apparatus and method wherein a reset pulse for precharging a dynamic logic circuit is properly timed. A basic overview of the invention is shown in a block diagram of the circuitry in FIG. 1.

There, dynamic logic circuit 500 outputs both data and its logical complement. Dynamic logic circuitry 500 is comprised of dynamic hold circuits 10 and 20.

Assume dynamic logic circuit 500 currently holds valid data. The state in which the logic circuit provides a valid data output will be referred to as an evaluation state for the purposes of the following claims. Dynamic hold circuitry 10 holds and outputs data T on output 30, while dynamic hold circuitry 20 holds and outputs C, the logical complement of data T, on output 40. By ORing the outputs 30 and 40 together, the data T and its complement C, at OR gate 50, output 60 of OR gate 50 should remain logically true while the data is valid. The only time output 60 can go logically false is when both T and C are both logically false.

Assume that a reset input 70 has been asserted to precharge dynamic logic circuit 500, and prepare dynamic logic circuit 500 for new data. Reset input 70 is ANDed in gate 80 with the output 60, the ORed output of hold circuits 10 and 20. Output 90 of AND gate 80 is high only when reset input 70 and output 60 of OR gate 50 are high. This forms precharge signal 90, which dynamic logic circuit 500 uses to initiate its precharge.

When dynamic logic circuit 500 completely precharged, that is, when the logic circuit is in a precharged state both output C and T are driven low to provide common signals. When C and T are driven low, output 60 is driven low, and thus output 90 of AND gate 80 is driven low, ending the precharge or reset pulse to dynamic logic circuit 500.

In the preferred embodiment, dynamic logic circuit 500 indicates it has been precharged when both hold circuits 10 and 20 outputs are driven negative. When both outputs 30 and 40 are driven low, this indicates that dynamic logic circuit 500 is ready to receive data. When dynamic logic circuit 500 has not reached the precharge state, it still outputs data T and its complement on outputs 30 and 40. When dynamic logic circuit 500 has reached a precharge level, outputs 30 and 40 are driven low. Thus, when the circuit is precharged and ready to receive data, precharge line 90 is driven low.

In another embodiment, a precharge could be indicated by both outputs being driven high, and appropriate logic can be designed using basic digital logic techniques to convert the preferred embodiment to one which is driven by output lines 30 and 40 both going high to indicate precharge.

FIGS. 2 and 3 further detail a specific embodiment of the invention. FIG. 2 is a schematic of the specific embodiment, and FIG. 3 is a timing diagram of the same circuit. In this embodiment, outputs 30 and 40 indicate precharge when they are both driven low.

In the normal evaluative state, NMOS transistor 470 is on. However during precharge mode, transistor 470 is turned off.

Turning to the data hold circuitry for output C, if C is low, PMOS transistor 380 is turned on and NMOS transistor 400 is turned off, keeping line 345 high. When line 345 is high, this turns on NMOS transistor 480 and turns off PMOS transistor 360, keeping output C low.

If output C is high, PMOS transistor 380 is turned off and NMOS transistor 400 and 470 are turned on, thus turning on transistor 360 and turning off transistor 480, keeping line 345 low. This action keeps output C high by switching transistor 360 on and transistor 480 off.

The data hold circuitry for output T, namely transistors 370, 390, 410, and 490 all work in a similar manner to transistors 360, 380, 400, and 480 respectively, to maintain output T.

Dynamic hold circuit output lines 30 and 40 are fed into NOR gate 210, and the resulting output 220 is negated by inverter 230. Thus, signals C and T, representing data and its complement in the dynamic hold circuits are ORed together at inverter output 240. Clock line 250 is negated at inverter 260, and NANDed at NAND gate 270 with output 240, with NANDED output 280.

The resulting logic diagram of output 240 is detailed in FIG. 4., and the logic diagram for output 280 is detailed in FIG. 5. Thus, when signal at output 240, C ORed with T, is low, NANDED output 280 will be high. Thus, output 280 will go high when the outputs of C and T indicate the circuit has been precharged. Only when output 240, C ORed with T, is high, indicating the circuit is not precharged, and clock line 250 is low, will NANDED output 280 be low.

NAND output 280 is ORed with reset complement line 290. In FIG. 2, this is accomplished by NORing NAND output 280 with reset complement line 290 at NOR gate 300. Output 310 of NOR gate 300 is then inverted with inverter 320 to produce precharge output 330. The logic diagram of output 330 is detailed in FIG. 6.

When output 240, C ORed with T, is high, indicating dynamic logic circuit 50 is being evaluated, precharge output 330 goes low when reset complement line 290 goes low and clock line 250 goes low. Precharge output 330 going low then turns on PMOS transistors 340 and 350.

When PMOS transistor 340 output 345 goes high, this turns off PMOS transistor 360 and turns on NMOS transistor 480, forcing output C low. PMOS transistor 350 output 355 similarly turns off PMOS transistor 390 and turns on NMOS transistor 490, forcing output T low. When precharge output 330 goes low, this shuts off transistor 470, further allowing outputs C and T to be driven low.

Thus, C and T are both driven low and indicative of being precharged. In turn, ORed output 240 is driven low, in turn driving NANDED output 280 high. NANDED output 280 going high causes precharge output 330 to then switch high, and thus turning off transistors 340 and 350. Thus, the dynamic hold circuit indicates that the circuit has been precharged. Upon being precharged, dynamic hold circuit outputs C and T signal indicate this event by both being low. This in turn switches output 240 low, thus switching output 280 high. This in turn forces precharge output 330 high, turning off transistors 340 and 350. Feedback transistors 380 and 390 maintain the precharge in the data hold circuits.

When clock signal 250 rises, this turns on transistor 420, allowing selected data to be introduced to the data hold circuitry, exemplified by transistors 360, 380, 400, 480, and output C. When line 500 is asserted low, the data on line 520 will be introduced to the data hold circuitry via transistors 430 and 440. If line 510 is asserted low, the data on line 530 will be introduced to the data hold circuitry via transistors 450 and 460. It should be noted that line 500 and 510 are mutually exclusive data select lines, therefore only one of them at a time should be asserted low.

When data is present on output T, and its complement is present on output C, this re-enables the circuit for a new precharge output 330 to be generated. This new precharge output will be enabled when a new reset signal is asserted low on line 290 and the clock is low. It should be noted that either reset complement line 290 can be asserted, or the clock go low before the other. However, both these events have to occur together for precharge output 330 to be generated, and the data hold circuits be precharged.

Turning to FIG. 3, timing diagram 600 follows the discussion relating to the schematic in FIG. 2. Clock line 250 goes low at point 610 on timing diagram 600. Reset complement line 290 is asserted low at point 620, at some point after point 610. As noted before, the order of these events is not critical, and the reset may be asserted either before or after the clock goes low.

These two events causes precharge indicator 330 to go low as shown at point A on FIG. 3. Precharge indicator 330 being forced low causes outputs T and C to both go low, as shown on at point B on timing diagram 600. T and C forced low then causes precharge indicator 330 to go high again, as shown at event C on timing diagram 600.

When clock line 250 goes up, selected data is input into the hold circuits, where output T is the data and output C is the complement of data T.

It should be noted that the described invention could be implemented using any logic state that the dynamic circuit uses to indicate a precharge. Although the present invention has been described with respect to the specific embodiments above, it will be appreciated by those of skill in the art that variations in form and detail may be made without departure from the scope and spirit of the present invention.

We claim:

1. An apparatus for providing a precharge signal to precharge a dynamic logic circuit, the dynamic logic circuit having first and second outputs providing true and complementary data output states when the dynamic logic circuit is in an evaluation state, and providing dual common output states when the dynamic logic circuit is in a precharged state, the apparatus comprising:

(a) an output sensing circuit coupled to the dynamic logic circuit, the output sensing circuit for providing an enable signal in response to the true and complementary data output states from the dynamic logic circuit, and for discontinuing the enable signal in response to the common output states from the dynamic logic circuit; and (b) a precharge control circuit for receiving the enable signal and a reset signal, and for providing a precharge signal to the dynamic logic circuit in response to the receipt of the enable signal at the precharge control circuit concurrently with the receipt of the reset signal at the precharge control circuit.

2. The apparatus of claim 1 wherein the dynamic logic circuit includes a new data input on which data is received for evaluation by the dynamic logic circuit.

3. The apparatus of claim 2 wherein a clock signal enables the dynamic logic circuit for evaluating the new data received on the new data input.

4. The apparatus of claim 1 wherein the common output states are at a negative logic level.

5. The apparatus of claim 1 wherein the reset signal comprises a global signal which is simultaneously provided to a plurality of dynamic logic circuits.

6. The apparatus of claim 1 wherein the output sensing circuit includes an OR gate having a first input connected to the first output of the dynamic logic circuit and a second input connected to the second output of the dynamic logic circuit.

7. The apparatus of claim 1 wherein the precharge control circuit includes an AND gate having a first input connected to receive the enable signal and a second input connected to receive the reset signal.

8. A method for controlling the precharge of a dynamic logic circuit, the dynamic logic circuit having a first output and a second output providing true and complementary data output states when the dynamic logic circuit is in an evaluation state, and providing dual common output states when the dynamic logic circuit is in a precharged state, the method comprising:

(a) sensing when the dynamic logic circuit provides the true and complementary data output states;

(b) providing an enable signal when the true and complementary data output states are sensed from the dynamic logic circuit; and (c) providing a precharge signal to the dynamic logic circuit in response to the concurrent receipt of the enable signal and a reset signal.

9. The method of claim 8 wherein the step of providing the enable signal includes:

(a) logically ORing the true and complementary data output states and applying an output of the OR operation as the enable signal.

10. The method of claim 8 wherein the step of providing the precharge signal to the dynamic logic circuit includes:

(a) logically ANDing the reset signal and the enable signal and applying an output of the AND operation as the precharge signal.

* * * * *